(12) United States Patent
De Vries et al.

(10) Patent No.: US 9,372,413 B2
(45) Date of Patent: Jun. 21, 2016

(54) OPTICAL APPARATUS FOR CONDITIONING A RADIATION BEAM FOR USE BY AN OBJECT, LITHOGRAPHY APPARATUS AND METHOD OF MANUFACTURING DEVICES

(75) Inventors: Gosse Charles De Vries, Veldhoven (NL); Jan Bernard Plechelmus Van Schoot, Eindhoven (NL); Franciscus Johannes Joseph Janssen, Geldrop (NL); Nicolaas Aldegonda Jan Maria Van Aerle, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 797 days.

(21) Appl. No.: 13/433,923

(22) Filed: Mar. 29, 2012

(65) Prior Publication Data

US 2012/0262688 A1 Oct. 18, 2012

Related U.S. Application Data

(60) Provisional application No. 61/475,829, filed on Apr. 15, 2011, provisional application No. 61/522,959, filed on Aug. 12, 2011.

(51) Int. Cl.
*G03B 27/42* (2006.01)
*G03F 7/20* (2006.01)

(52) U.S. Cl.
CPC ........ *G03F 7/70575* (2013.01); *G03F 7/70075* (2013.01); *G03F 7/70116* (2013.01); *G03F 7/70158* (2013.01); *G03F 7/70191* (2013.01)

(58) Field of Classification Search
CPC ............ G03F 7/70191; G03F 7/70075; G03F 7/70091; G03F 7/70158; G03F 7/70575; G03F 1/58; G03F 7/7055

USPC .......................................... 355/53, 63, 71, 77
See application file for complete search history.

(56) References Cited

U.S. PATENT DOCUMENTS

| | | |
|---|---|---|
| 2002/0097385 A1 | 7/2002 | Van Elp et al. |
| 2003/0043455 A1 | 3/2003 | Singer et al. |

(Continued)

FOREIGN PATENT DOCUMENTS

| | | |
|---|---|---|
| JP | 2008-288299 A | 11/2008 |
| WO | WO 2009/144117 A1 | 12/2009 |

OTHER PUBLICATIONS

Abstract of App. No, JP 2008-288299 A, published Nov. 27, 2008; 1 page.

*Primary Examiner* — Mesfin T Asfaw
(74) *Attorney, Agent, or Firm* — Sterne, Kessler, Goldstein & Fox P.L.L.C.

(57) ABSTRACT

In an EUV (extreme ultraviolet) lithography apparatus, an illumination system includes a multifaceted field mirror and a multifaceted pupil mirror. A field facet mirror within mirror focuses EUV radiation onto a particular associated pupil facet mirror, from where it is directed to a target area. Each field facet mirror is modified to scatter unwanted DUV (deep ultraviolet) radiation into a range of directions. The majority of DUV falls onto neighboring pupil facet mirrors within the pupil mirrors, so that the amount of DUV radiation reaching target E is suppressed in comparison to the wanted EUV radiation. Because the distance between mirrors is much greater than the width of an individual pupil facet mirror, good DUV suppression can be achieved with only a narrow scattering angle. Absorption of EUV radiation in the scattering layer can be minimized.

20 Claims, 8 Drawing Sheets

(56) References Cited

U.S. PATENT DOCUMENTS

| | | |
|---|---|---|
| 2003/0058529 A1 | 3/2003 | Goldstein |
| 2005/0157282 A1 | 7/2005 | Bakker |
| 2005/0275818 A1* | 12/2005 | Singer .............................. 355/55 |
| 2008/0259458 A1 | 10/2008 | LaFontaine et al. |
| 2009/0267003 A1* | 10/2009 | Moriya et al. ........... 250/492.22 |

* cited by examiner

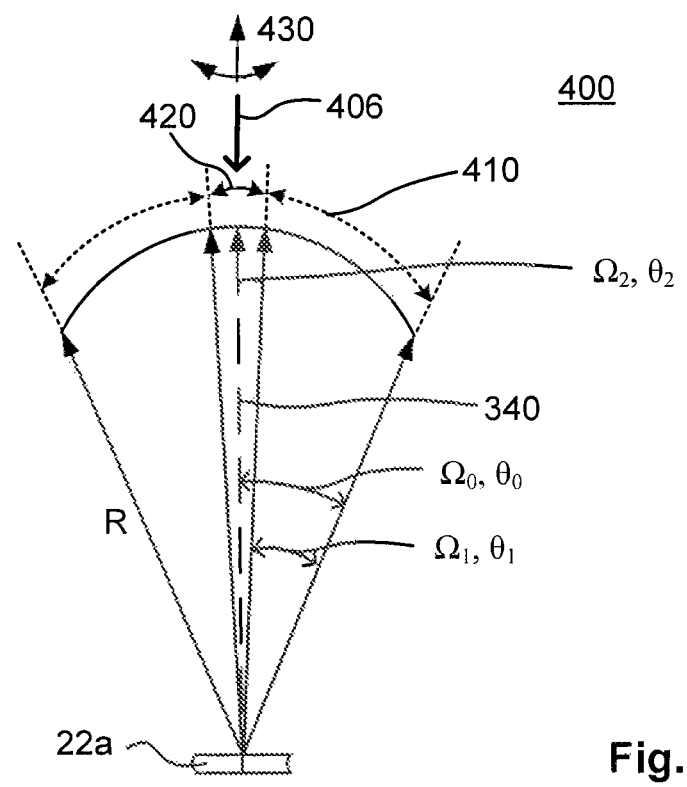
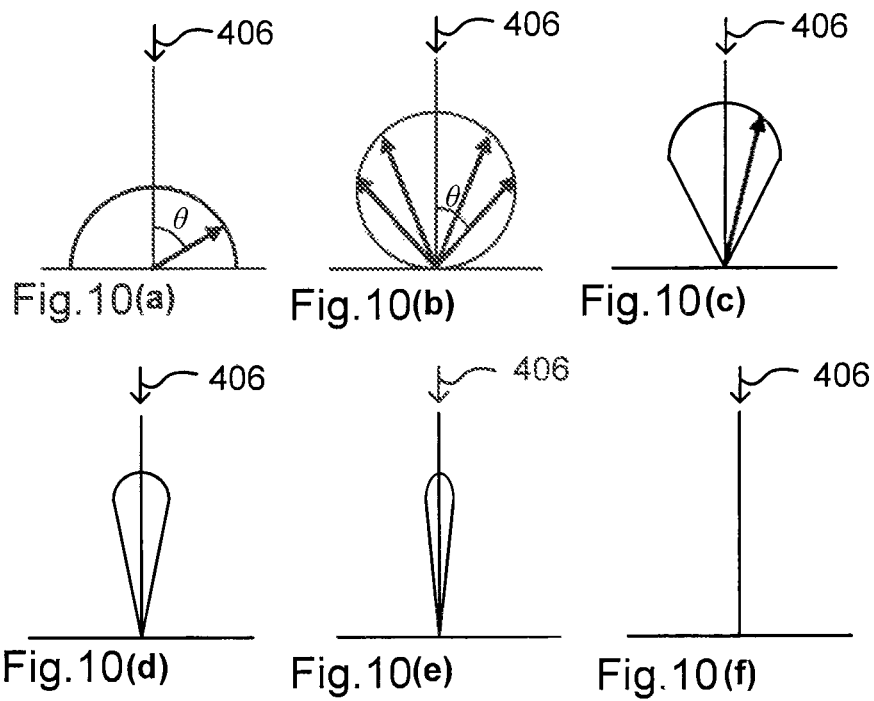
Fig. 9
Fig.10(a) Fig.10(b) Fig.10(c)
Fig.10(d) Fig.10(e) Fig.10(f)

OPTICAL APPARATUS FOR CONDITIONING A RADIATION BEAM FOR USE BY AN OBJECT, LITHOGRAPHY APPARATUS AND METHOD OF MANUFACTURING DEVICES

CROSS REFERENCE TO RELATED APPLICATIONS

This application claims the benefit under 35 U.S.C. §119 (e) to U.S. Provisional Patent Application No. 61/475,829, filed Apr. 15, 2011, and U.S. Provisional Patent Application No. 61/522,959 and Aug. 12, 2011, which are incorporated by reference herein in their entireties.

FIELD

The invention relates to conditioning of a radiation beam to suppress radiation with undesired wavelength, and may be applied for example to condition a radiation beam in the field of lithography. The invention has been developed particularly for conditioning a radiation beam in extreme ultraviolet (EUV) lithography to suppress deep ultraviolet (DUV) radiation, but is not limited to such application, not to such particular wavelength ranges.

BACKGROUND

Lithography is widely recognized as one of the key steps in the manufacture of integrated circuits (ICs) and other devices and/or structures. However, as the dimensions of features made using lithography become smaller, lithography is becoming a more critical factor for enabling miniature IC or other devices and/or structures to be manufactured.

A lithographic apparatus is a machine that applies a desired pattern onto a substrate, usually onto a target portion of the substrate. A lithographic apparatus can be used, for example, in the manufacture of ICs. In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Current lithography systems project mask pattern features that are extremely small. Dust or extraneous particulate matter appearing on the surface of the reticle can adversely affect the resulting product. Any particulate matter that deposits on the reticle before or during a lithographic process is likely to distort features in the pattern being projected onto a substrate. Therefore, the smaller the feature size, the smaller the size of particles critical to eliminate from the reticle.

A pellicle is often used with a reticle. A pellicle is a thin transparent layer that may be stretched over a frame above the surface of a reticle. Pellicles are used to block particles from reaching the patterned side of a reticle surface. Although particles on the pellicle surface are out of the focal plane and should not form an image on the wafer being exposed, it is still preferable to keep the pellicle surfaces as particle-free as possible.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are typically configured to output a radiation wavelengths of around 5-20 nm, for example, 13.5 nm or about 13 nm or 6.5-6.8 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

Some EUV sources, especially plasma sources, emit radiation over a wide range of frequencies, even including infrared (IR), visible, ultraviolet (UV) and deep ultraviolet (DUV) radiation. Radiation of these unwanted frequencies will propagate and cause heating problems in the illumination and projection systems and cause unwanted exposure of the resist if not blocked. Although the multilayer mirrors of the illumination and projection systems are optimized for reflection of the desired wavelength e.g., 13 nm, they have quite high reflectivities at IR, visible and UV wavelengths. As the resist to be exposed to the EUV radiation at the substrate is also sensitive to the non-EUV radiation like the DUV radiation, and the non-EUV radiation at the substrate does not contain information of mask pattern features. Instead, the presence of non-EUV radiation at the wafer stage only contributes to contrast loss. As such, it is desirable to keep the ratio of non-EUV radiation to EUV radiation below a certain value, which may be 1% at the substrate, just for example.

It has been proposed to use a filter to perform this function, such as a membrane-like spectral purity filter. However, such a filter is very delicate and has a limited heat load capability, leading to high thermal stresses and cracking, sublimation and oxidation in the high power levels of radiation occurring in a lithographic projection apparatus. A membrane filter also generally absorbs a significant portion of the desired EUV radiation. For example, DUV radiation may be suppressed by factor greater than 100 at the expense of 30% EUV radiation loss.

It has also been proposed to use a DUV-suppressing coating on one or more mirrors in the illumination and projection systems of a lithographic apparatus to perform this function. However, by using the DUV coating, the EUV radiation loss as compared to the DUV suppression is worse than that of using a membrane filter. Also, the approach of using a DUV-suppressing coating is insufficient as the reduction of the DUV to EUV ratio is limited to about a factor of 3.

SUMMARY

It is desirable to have an alternative technique to reduce unwanted wavelengths of radiation in a reflective optical system such as an EUV lithographic apparatus.

According to a first aspect of the invention, there is provided an optical apparatus for conditioning a radiation beam, the apparatus comprising a first reflective component arranged to receive the radiation beam from a radiation source, and to reflect the radiation beam to a second reflective component, the first reflective component comprising a primary reflective element, the second reflective component being arranged to reflect the beam to a target location and comprising an array of secondary reflective elements, wherein the primary reflective element is arranged to reflect radiation in a first wavelength range to an associated secondary reflective element or to one of a subset of associated secondary reflective elements, and wherein the primary reflective element is formed such that radiation in a second wavelength range will be subject to a degree of scattering, the degree of scattering being set such that a majority of the radiation in the second wavelength range is directed toward the second reflective component, but not toward the associated secondary reflective element or toward the subset of associated secondary reflective elements.

The apparatus may be applied in an illumination system of an EUV lithographic apparatus. The primary reflective element may be a field facet mirror while the secondary reflective elements are pupil facet mirrors of a multifaceted pupil facet mirror. In such embodiments, the first wavelength range may be in the EUV wavelength range 5-20 nm, for example in the range 13-14 nm or 6.5-7 nm. The second wavelength range may be in the DUV wavelength range 100-400 nm, optionally 110-300 nm.

The degree of scattering may be such that less than 25%, optionally less than 15%, 5% or 1%, of the radiation in the second wavelength range is directed from the primary reflective element to the associated secondary reflective element or to one of a subset of associated secondary reflective elements. In some embodiments an orientation of the primary reflective element is controllable so as to direct radiation toward one of the subset of associated secondary reflective elements at different times, each of the associated secondary reflective elements being surrounded in the array of secondary reflective elements by secondary reflective elements that will direct radiation received from the primary reflective element in a direction away from the target location.

The primary reflective element may be one element of an array of primary reflective elements, each of the primary reflective elements being associated with a particular secondary reflective element or subset of elements in the second reflective component, and each of the primary reflective elements being arranged to provide a corresponding degree of scattering of radiation in the second wavelength range. The primary reflective element comprises a mirror structure for reflecting the radiation in the first wavelength range and a coating on top of the mirror structure for imposing the degree of scattering on the radiation in the second wavelength range. In an embodiment the coating may for example comprise a layer of silicon particles of dimension less than 100 nm, optionally less than 30 nm.

In one embodiment the primary reflective element incorporates a phase grating structure configured to suppress reflection toward the target location of radiation in a third wavelength range, wavelengths in the third wavelength range being longer than 1 μm.

The invention further provides a lithographic apparatus, comprising an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and an optical apparatus according to an embodiment of the invention as set forth above, configured to condition a radiation beam received from a radiation source in the illumination system.

The invention further provides a device manufacturing method comprising projecting a patterned beam of radiation onto a substrate, wherein the patterned beam is formed from a radiation beam which is conditioned by an optical apparatus as set forth above.

According to an aspect of the invention there is provided an optical apparatus for conditioning a radiation beam of radiation including radiation in a first wavelength range, the apparatus comprising a primary reflective element and an array of secondary reflective elements including an associated secondary reflective element arranged to project the primary reflective element onto a target location, the primary reflective element arranged to receive a portion of the radiation beam from a radiation source, and to reflect the portion of radiation to the associated secondary reflective element, wherein the radiation beam further includes radiation in a second wavelength range, and wherein the primary reflective element is formed such that radiation, of the portion of radiation, in the second wavelength range will be subject to a degree of scattering, the degree of scattering being set such that a majority of the radiation, of the portion of radiation, in the second wavelength range is directed one or more elements of the plurality of secondary reflective elements different from the associated secondary reflective element.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which:

FIG. 9 illustrates a cross sectional view of a model scattering profile of a radiation beam incident on a primary reflective element;

FIG. 10 illustrates exemplary theoretical scattering profiles (a)-(e) of a scattered radiation beam, in comparison with (f) specular reflection;

Figure 1:
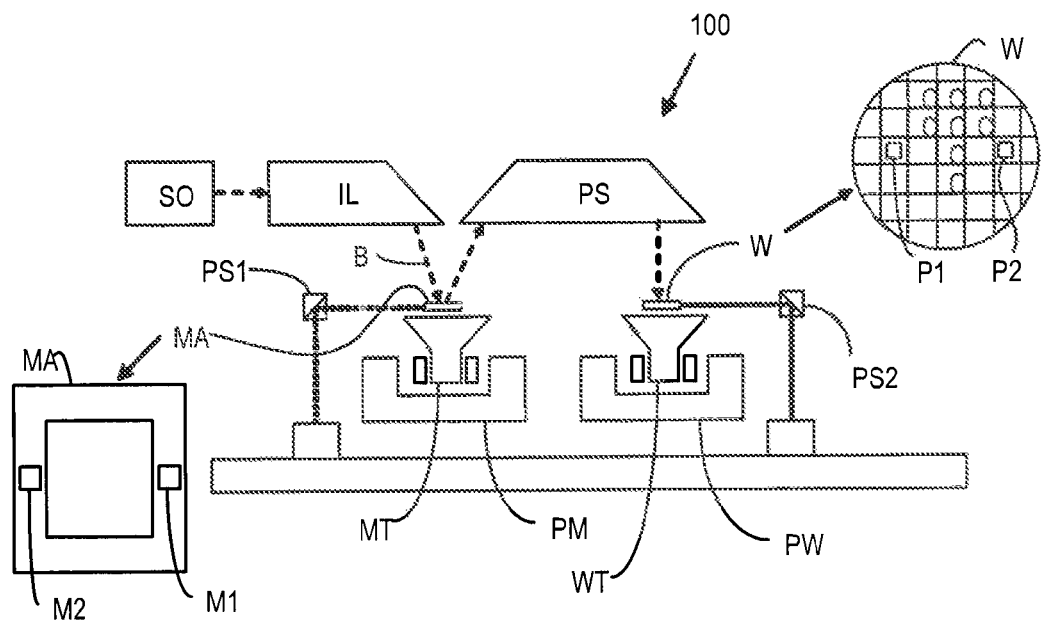
FIG. 1 depicts schematically a lithographic apparatus having reflective projection optics.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus 100 including a source collector module SO according to one embodiment of the invention. The apparatus comprises an illumination system (illuminator) IL configured to condition a radiation beam B (e.g., EUV radiation), a support structure (e.g., a mask table) MT constructed to support a patterning device (e.g., a mask or a reticle) MA and connected to a first positioner PM configured to accurately position the patterning device, a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
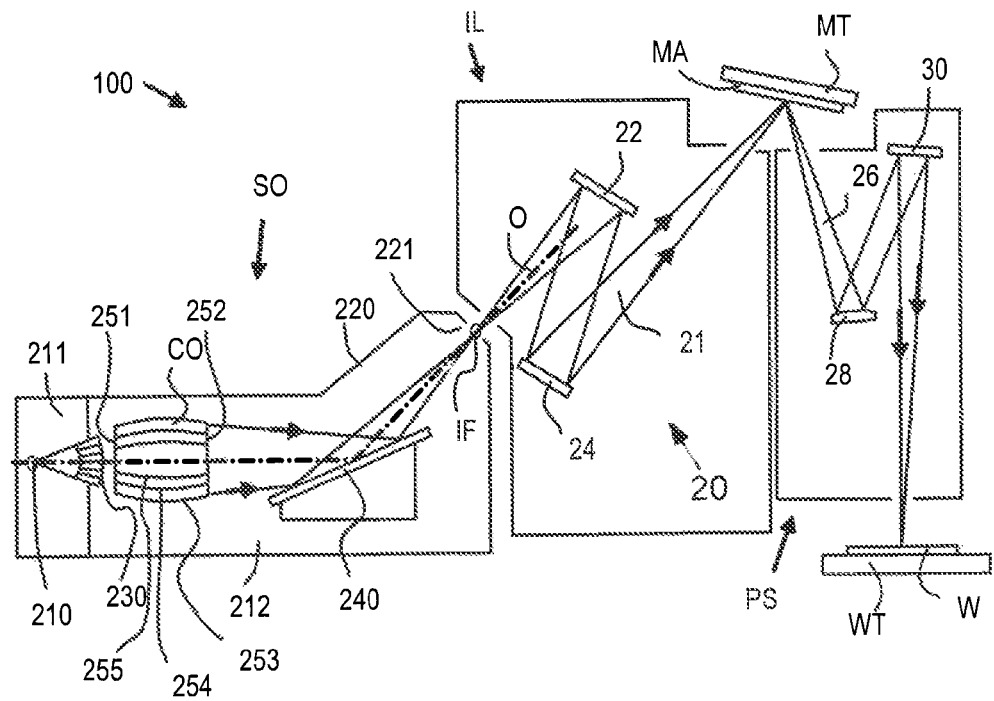
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral purity filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
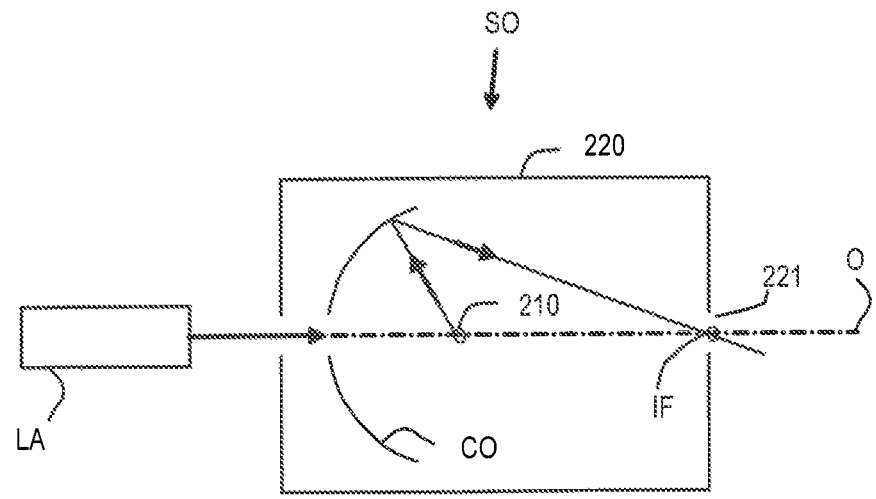
FIG. 3 is a more detailed view of an alternative source collector module SO for the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

In United States Patent Application Publication US 2005/0157282 (Bakker), incorporated by reference herein in its entirety, it is proposed to apply a DUV-scattering coating to a mirror in an EUV optical system. The purpose is to spread the DUV radiation over a wide range of angles, such that the majority of it misses the target. In this way, the DUV radiation following the same optical path as the EUV radiation is reduced. However, to achieve sufficient DUV scattering may require a coating of such thickness that the EUV radiation (which has to travel twice through the coating) is also attenuated and/or scattered to an undesirable extent.

Figure 4:
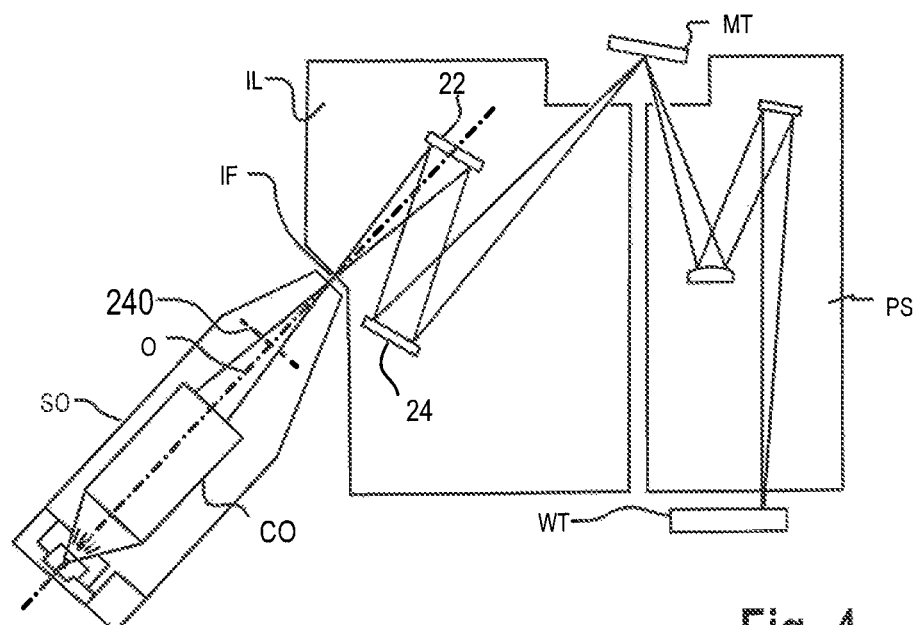
FIG. 4 depicts an alternative example of an EUV lithographic apparatus.

FIG. 4 shows an alternative arrangement for an EUV lithographic apparatus in which the spectral purity filter 240 is of a transmissive type, rather than a reflective grating. The radiation from source collector module SO in this case follows a straight path from the collector optic to the intermediate focus IF (virtual source point). Note that positioning the filter close to or at the IF will lead to very high absorbed power densities. The high temperatures that result may degrade the filter. On the other hand, the filter area can be small, which is an advantage.] In alternative embodiments, not shown, the spectral purity filter 240 may be positioned at the virtual source point IF or at any point between the collector optic CO and the virtual source point IF. The filter can be placed at other locations in the radiation path, for example downstream of the virtual source point IF. Multiple filters can be deployed. As in the previous examples, the collector optic CO may be of the grazing incidence type (FIG. 2) or of the direct reflector type (FIG. 3). The spectral purity filter may be designed to suppress unwanted radiation in the infrared wave band, leaving DUV radiation to be suppressed by other means.

The following description presents optical apparatus and methods that can condition a radiation beam being directed at a target location on an object. The object can be, for example, a lithographic patterning device MA for generating a circuit pattern to be formed on an individual layer in an integrated circuit, or a substrate W on a substrate table WT of a lithographic apparatus. The target location may be an area of the patterning device MA illuminated by the illumination system IL. Example patterning devices include a mask, a reticle, or a dynamic patterning device. The reticles can also be for use within any lithography process, while the emphasis in this application will be on EUV lithography.

Figure 5:
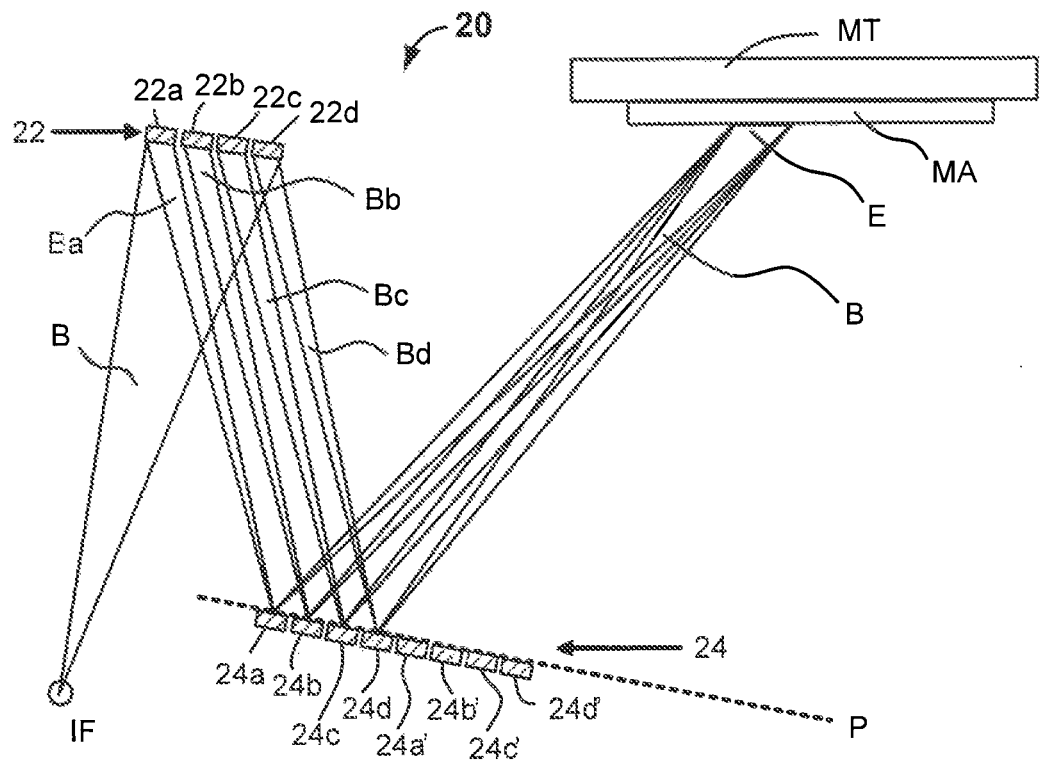
FIG. 5 depicts a cross sectional view of an exemplary optical apparatus for conditioning a radiation beam in the illumination system of a lithographic apparatus according to an embodiment of the present invention.

FIG. 5 schematically shows a cross sectional view of an exemplary optical apparatus 20 for conditioning a radiation beam in the illumination system IL of a lithographic apparatus according to an embodiment of the present invention. Apparatus 20 includes a first reflective component 22 in the form of facetted field mirror device 22 and a second reflective component 24 in the form of facetted pupil mirror device 24. Facetted field mirror device 22 comprises a plurality of primary reflective elements, some particular ones schematically indicated in FIG. 5 and referred to as field facet mirrors 22a, 22b, 22c and 22d. The second reflective component 24 comprises a plurality of secondary reflective elements including, for example, the particular secondary reflective elements referred to as pupil facet mirrors 24a, 24b, 24c, 24d, and 24a', 24b', 24c', 24d'.

Generally, the field facet mirrors 22a-d direct respective portions of incoming radiation beam B towards the pupil facet mirrors 24a-d, 24a'-d'. Although only four field facet mirrors 22a-d are shown, any number of field facet mirrors may be provided. The field facet mirrors may be arranged in a generally two-dimensional array, which does not mean that they should lie strictly in a flat plane. Although only eight pupil facet mirrors 24a-d, 24a'-d' are shown, any number of pupil facet mirrors may be provided. The number being typically a multiple of the number of field facet mirrors. The pupil facet mirrors may be arranged in a two-dimensional array. The shapes and configurations of the field facet mirrors and pupil facet mirrors may be square, rectangular, circular, or more complicated in shape, according to design.

Each field facet mirror 22a-d reflects a portion of the radiation beam B received by the first reflective component (22) in the form of a sub-beam of radiation towards a different pupil facet mirror 24a-d of the pupil mirror device 24. For example, a first sub-beam Ba is directed by a first field facet mirror 22a to a first pupil facet mirror 24a. Second, third and fourth sub-beams Bb, Bc and Bd are directed by second, third and fourth field facet mirrors 22b, 22c, and 22d respectively to second, third and fourth pupil facet mirrors 24b, 24c, and 24d. The spatial intensity distribution of the radiation beam B at the pupil mirror device 24 can define an illumination mode of the lithographic apparatus. In one embodiment, the field facet mirrors 22a-d have adjustable orientations, and they may be used with different ones of the pupil facet mirrors 24a-d, 24a'-d', to form different spatial intensity distributions at the pupil plane P, thereby providing different illumination modes. This option, which is known per se, will be described later with reference to FIG. 13. The pupil facet mirrors 24a-d may also be adjustable in orientation.

Each of the field facet mirrors 22a-d is shaped to have a desired optical power so as to form an image of the intermediate focus IF at a different pupil facet mirror 24a-d, of the pupil mirror device 24. In practice, the intermediate focus IF will be a virtual image of the plasma source, the image having a finite diameter (e.g., 4-6 mm). Consequently, each field facet mirror 22a-d will form an image of the virtual source point IF which has a finite diameter (e.g., 3-5 mm) at the pupil facet mirrors 24a-d. The pupil facet mirrors 24a-d, may each have a diameter which is larger than the aforementioned image diameter (to avoid radiation falling between pupil facet mirrors and thereby being lost). The intermediate focus IF and images of the intermediate focus IF are shown as points in the figures for ease of illustration only.

Each one of the pupil facet mirrors 24a-d is arranged to project its associated field facet mirror 22a-d at or near the field plane wherein the patterning device MA is located during exposure of a substrate. These projections may result in respective images of the field facet mirrors, and these projections or images are substantially overlapping and together form an illumination area E. As a result, a spatially non-uniform intensity distribution in a cross section of the radiation B as emanating from the source SO and received by the apparatus 20 is conditioned to have a substantially spatially uniform intensity distribution in the illumination area E. The shape of the illumination area E is determined by the shape of the field facet mirrors 22a-d, i.e., by the shape of an edge of the reflecting surface or mirror surface of the field facet mirrors 22a-d. In a scanning lithographic apparatus the illumination area E may for example be a rectangle or a curved band, when viewed in two dimensions which in the scanning direction has a width narrower than the width in a direction perpendicular to the scanning direction.

The facetted mirror devices 22 and 24 together form a so-called "fly's eye" illuminator, by which non-uniformities present in the radiation source are eliminated to illuminate area E with more even distribution, and with more control. A wavelength of the desired part of radiation may be an EUV wavelength in the range 5-20 nm, for example 13.5 nm. As discussed in the introduction, unfortunately the beam B also includes large amounts of unwanted radiation, for example at DUV wavelengths. Summarizing the above, the optical apparatus 20 for conditioning the radiation beam B comprises the first reflective component 22 arranged to receive the radiation beam B from the radiation source SO and to reflect the radiation beam B to the second reflective component 24. The second reflective component 24 is arranged to reflect the beam B to a target location, e.g., area E in FIG. 5. The radiation of the radiation beam B comprises radiation in a first wavelength range including, for example EUV radiation, and radiation in a second wavelength range, including, for example, DUV radiation. The first and second reflective components 22 and 24 comprise respective first and second arrays of respective primary and secondary reflective elements. A particular primary reflective element 22a is arranged to reflect desired radiation to an associated secondary element 24a or to one of a subset of associated secondary reflective elements 24a, 24a' as illustrated in FIG. 5. It is appreciated that the primary reflective components, also referred to as field facet mirrors, are substantially optically conjugate to a notional plane which may serve as an object plane for a projection system of the lithographic apparatus. Further, may also be referred to as field facet mirrors. Similarly, the secondary reflective components, also referred to as pupil facet mirrors, are substantially optically conjugate to, or coincident with a pupil plane of the optical apparatus 20. The latter pupil plane may in turn be arranged in a position which is optically conjugate to a pupil of the projection system of the lithographic apparatus.

In accordance with an embodiment of the present invention, one or more of the field facet mirrors 22a-d is modified so as to scatter the unwanted DUV radiation sufficiently that a majority of the unwanted radiation falls onto parts of pupil mirror device 24 other than the particular pupil facet mirror(s) associated with the one (or more) field facet mirror(s). In this "fly's eye" illuminator the complete set of field facet to pupil facet associations can be designed so that, given a particular primary reflective element, the pupil facet mirrors immediately neighboring to the corresponding associated pupil facet mirror will reliably direct radiation in the second wavelength range onto an area other than the illumination area E on the patterning device MA. The inventors have recognized that it is therefore not necessary to scatter a substantial amount of DUV radiation away from the entire pupil mirror device 24, in order to reduce substantially the radiation with undesired wavelength reaching the patterning device MA. The unwanted radiation only needs to be scattered away from the particular pupil facet mirror. Consequently, to achieve a same result of suppression of radiation with undesired wavelength, the degree of scattering required of a scattering layer of field mirror device 22 may be significantly lower, compared to that of a scattering layer suggested in the prior art United States Patent Application Publication US 2005/0157282 (Bakker). A detailed description how a particular primary reflective element such as for example field facet mirror 22a in FIG. 5 can be formed such that the radiation in the second wavelength range will be subject to a degree of scattering, the degree of scattering being set such that a majority of the radiation in the second wavelength range is directed toward the second reflective component (24), but not toward the associated, particular secondary reflective element (24a) or the subset of associated secondary reflective elements (24a, 24a') is presented below and illustrated schematically in FIGS. 6-12.

Figure 6:
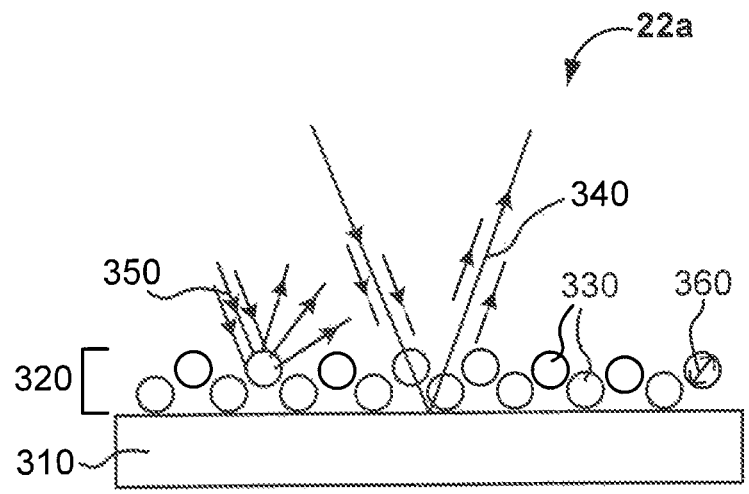
FIG. 6 depicts an exemplary optical element which can be used in the system of FIG. 5 as a primary reflective element.

FIG. 6 shows an exemplary primary reflective element 22a, also referred to hereinafter simply as optical element 22a, which may be used in apparatus 20 as a field facet mirror. Optical element 22a includes a substrate 310 and a scattering layer 320 on top of the substrate 310.

Scattering layer 320 has an index of refraction for radiation with a desired EUV wavelength close to unity. Therefore, the major part of radiation with that predetermined wavelength, such as EUV light, will propagate through scattering layer 320 without being substantially absorbed and without being substantially scattered. Scattering layer 320 also has an index of refraction not close to unity for radiation with a wavelength other the predetermined wavelength. Thus, part of radiation with a wavelength other than the predetermined wavelength, such as DUV light, may be scattered and/or absorbed by scattering layer 320.

Substrate 310 includes a multilayer reflector of a type well-known in EUV optics. The multilayer reflector is below the scattering layer 320. Therefore, after EUV radiation propagates through scattering layer 320, it is incident on the multilayer reflector and reflected by the multilayer reflector as a mirror.

As an example, scattering layer 320 may be formed by particles 330 with a diameter 360. The diameter 360 is in a scale of nanometers. A coating that may be used on optical element 22a is described in principle in paragraphs [0065]-[0078] of United States Patent Application Publication US 2005/0157282 (Bakker), incorporated by reference into this application in its entirety. If the diameter 360 of particles 330 is in the order of an undesired wavelength, for example DUV wavelength, scattering layer 320 is tuned to scatter radiation with undesired wavelength. Particles 330 may be made of silicon, for example, which is substantially transparent at EUV wavelengths. As will be seen, the strength of scattering required in the present application will be substantially less that than envisaged in U.S. Pat. No. 7,034,923, incorporated by reference into this application in its entirety, and so the layer 320 may be thinner, and/or different in composition (e.g., smaller particles) in the present application.

Figure 7:
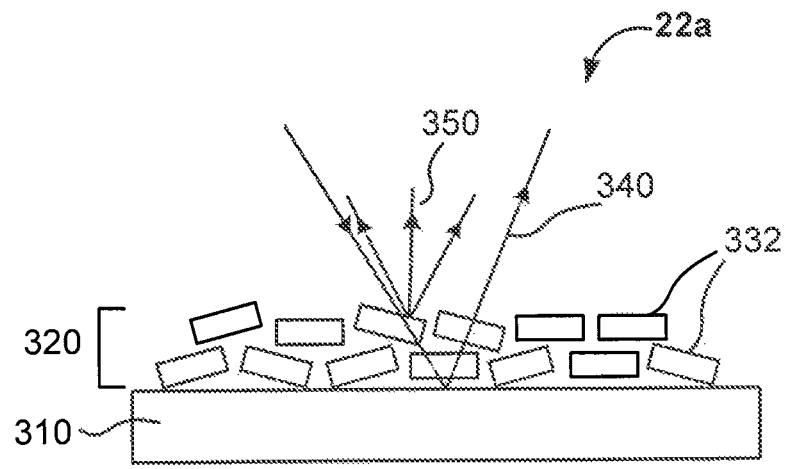
FIG. 7 depicts another exemplary optical element which can be used in the system of FIG. 5 as a primary reflective element.

In another example, scattering layer 320 may be formed with platelets 332 as shown in FIG. 7. The platelets 332 are in the size of micrometers or nanometers. For instance, to scatter DUV light with low EUV light loss, these platelets 332 may have lateral dimensions in the range of micrometers, which is greater than the DUV wavelength, and a thickness of 20 nm.

Figure 8:
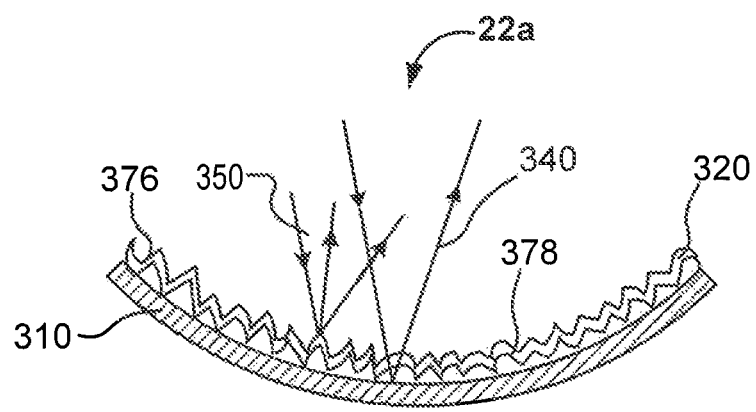
FIG. 8 depicts yet another exemplary optical element which can be used in the system of FIG. 5 as a primary reflective element.

As seen in FIG. 8, scattering layer 320 may be corrugated so as to enhance scattering. Also, as the optical element 22a may be in a curved shape, and scattering layer 320 and substrate 310 may be formed in a curved shape, accordingly. The corrugated scattering layer 320 may have front and rear corrugated surfaces 376 and 378 as shown in FIG. 8. (Curvature and corrugations are of course exaggerated in this drawing.) For the mechanical attachment of the rough layer with the corrugated rear surface 378, a limited amount of contact points with the substrate 310 will be sufficient to attach it to the substrate 310. Consequently, since part of radiation with the predetermined wavelength propagates through the scattering layer 320, unwanted radiation can be scattered by both surfaces 376 and 378 before it reaches the substrate 310. In another example, the corrugated scattering layer 320 may only have one corrugated surface 376, and radiation with the predetermined wavelength travels through only one corrugated surface 376 before it reaches the substrate 310. In the latter case, the loss of EUV radiation may be reduced, and also a coating with a single corrugated surface may be easier to manufacture (for example it may be formed directly on the substrate 310). Whatever the detailed implementation of scattering layer 320, its form and composition are such that radiation with undesired wavelength can be substantially scattered by scattering layer 320. For example, scattering layer 320 may be a layer made of silicon particles with a thickness of 20 nm, and may absorb 3-5% of EUV light incident on scattering layer 320. Scattering layer 320 may also absorb a portion of the unwanted radiation.

For a field facet mirror 22a-22d having a scattering layer 320, it is understood that when radiation is incident on a field facet mirror, part of radiation with a predetermined wavelength (in this application, EUV) propagates through scattering layer 320 and is reflected specularly by the field facet mirror, while radiation with a wavelength other than the predetermined wavelength (e.g., DUV) is scattered to a degree by scattering layer 320, and exits the mirror in a more diffused pattern.

FIG. 9 is a cross sectional view of an exemplary scattering profile 400 of a radiation beam 406 incident on a field facet mirror as shown in FIG. 5. It is understood that the exemplary scattering profile 400 is a three dimensional scattering profile that can be obtained by rotating the exemplary cross sectional view around a vertical axis 430. When a radiation beam 406 is scattered, a theoretical scattering profile of the radiation beam 406 may be one of exemplary profiles as shown in FIG. 10.

FIG. 10(a) is a theoretical profile of isotropic scattering, which emits the same energy density (in W/m$^2$) in every direction θ, as is indicated by the length of the arrow in this direction. All of the profiles are assume for simplicity to be circularly symmetrical about the beam 406. In reality, a scattering profile of radiation beam 406 may be one of profiles shown from FIG. 10(b) to (f). For a highly diffuse reflector, the scattering profile may be a scattering profile according to Lambert's cosine law, which gives the profile shown in FIG. 10(b). The energy density of the scattered radiation beam 406 in a direction θ has a dependency on cos θ, which results in an isotropic radiance, where radiance L (in W/m$^2$/sr) in the direction θ is defined as:

$$L = \frac{d^2\Phi}{dAd\Omega\cos\theta}, \qquad (1)$$

where A is the area of the scattering surface, Ω is the solid angle subtended by an observer (for example by a pupil facet mirror 24a-d), and Φ is the total emitted power. For a Lambertian scattering surface, equation (1) yields $$L = \frac{\Phi}{A\pi}, \qquad (2)$$

which does not depend on θ. Thus the Lambertian surface appears equally bright when viewed from any angle.

The scattering profiles as shown in Figure (c) to (e) are progressively more forward emitting, meaning that radiance L falls off more rapidly with increasing angle θ. Figure (f) is a specular reflection where all the incoming radiation beam 406 is reflected into only one direction. While incident and reflected rays are shown normal to the surface of mirror 22a, the principles described can be adapted readily to non-normal angles of incidence, according to the well known laws of reflections.

When radiation beam 406 is incident on a field facet mirror, part of radiation of the beam 406 with a predetermined wavelength, such as the EUV radiation 340 as shown in FIG. 9, can propagate through scattering layer 320 and is not scattered by scattering layer 320. Consequently, a field facet mirror can substantially act as a specular reflector for the radiation with the predetermined wavelength and reflect the EUV radiation 340 into one direction only. For the radiation beam 406, substantially all of the radiation with the desired wavelength is reflected in the direction 340.

However, part of the radiation beam 406 with a wavelength other than the desired wavelength is scattered by scattering layer 320. The radiation with undesired wavelengths is reflected with a range of angles, so as to fall in an annular spherical area 410, as well as a central area 420. If the central area 420 is the only part falling within the area of associated pupil facet mirror, a suppression factor S of radiation with undesired wavelengths is the ratio of the radiation falling within solid angle Ω$_1$ of the annular area 410 to the radiation falling within solid angle Ω$_2$ of the central area 420. If the radius R of the sphere is given, the suppression factor S of radiation with undesired wavelengths can be increased by reducing the solid angle Ω$_2$ of the spherical area 420, and/or by increasing the degree of scattering imposed by layer 320, to increase Ω$_0$.

Figure 11:
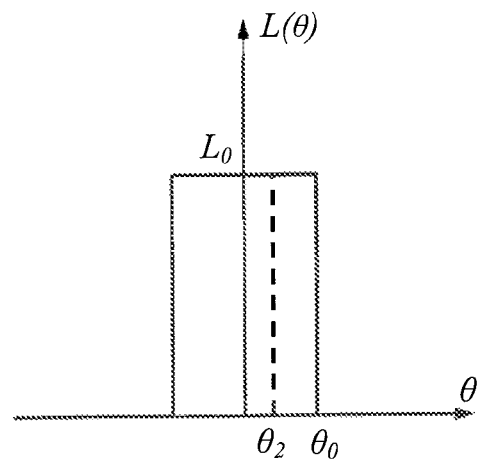
FIG. 11 illustrates a rectangular approximation of a scattering profile of a scattered radiation beam.

The exact suppression factor can be calculated by measuring and/or modeling the scattering profile of the scattering layer 320. As a very simple illustration, if the scattering profile 400 is narrow enough, like FIG. 10(e), it may be roughly approximated as a rectangular scattering profile as shown in FIG. 11. The solid angle Ω$_2$ of spherical area 420 is given by:

$$\Omega_2 = \frac{\pi(R\theta_2)^2}{R^2} = \pi\theta_2^2, \qquad (3)$$

The suppression factor S of radiation with undesired wavelengths is given by:

$$S = \frac{\pi(R\theta_0)^2 - \pi(R\theta_2)^2}{\pi(R\theta_2)^2} = \frac{\theta_0^2 - \theta_0^2}{\theta_2^2} = \left(\frac{\theta_0}{\theta_2}\right)^2 - 1, \quad (4)$$

When the $\theta_0$ is much greater than $\theta_2$, equation 4 is approximated as:

$$S \approx \left(\frac{\theta_0}{\theta_2}\right)^2. \quad (5)$$

From equations (4) and (5), it can be seen that the suppression factor S has a quadratic dependence on the maximum scattering angle $\theta_0$. The quadratic relation of the suppression factor S shows that strong suppression of radiation with undesired wavelengths, is obtained for scattering angles $\theta_0$ only a few times wider than $\theta_2$.

Figure 12:
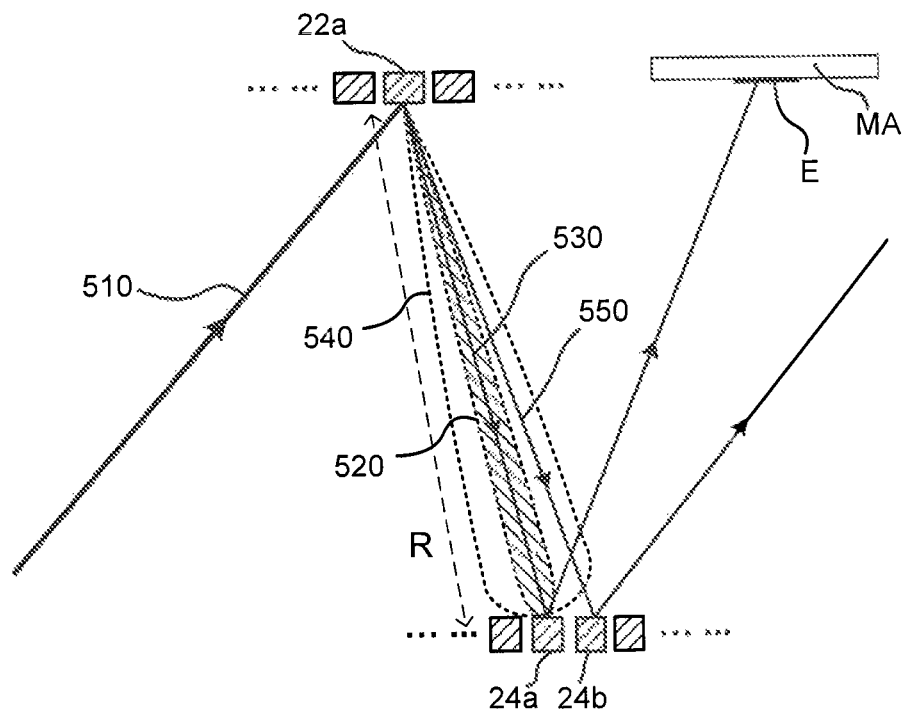
FIG. 12 illustrates an exemplary application of the principle shown in FIG. 9 to a system for conditioning a radiation beam as shown in FIG. 5.

FIG. 12 illustrates an exemplary application of the principle shown in FIGS. 9 and 11 to a system for conditioning a radiation beam as shown in FIG. 5. When an incoming radiation beam 510 is incident on a field facet mirror 22a, EUV radiation in the beam 510 is reflected by field facet mirror 22a and DUV radiation in the beam 510 is scattered by the layer 320 on field facet mirror 22a. As described already, each field facet mirror is configured to cooperate with an associated pupil facet mirror to direct radiation towards the illumination area E on a mask MA. For example, field facet mirror 22a has an associated pupil facet mirror 24a. These elements are designed and arranged such that radiation reflected by field facet mirror 22a to pupil facet mirror 24a will be directed onto the illumination area E.

Since EUV radiation 530 with the predetermined wavelength is not scattered by field facet mirror 22a but reflected by field facet mirror 22a and focused onto pupil facet mirror 24a, radiation 530 is directed onto the illumination area E by pupil facet mirror 24a. However, the DUV radiation with undesired wavelength is scattered by field facet mirror 22a with a cross sectional scattering profile 540. Only a minor portion 520 of this scattered DUV radiation falls on the associated pupil facet mirror 24a. The remaining, major part of the DUV radiation, including for example ray 550, falls between the pupil facet mirrors or onto one of the neighboring pupil facet mirrors 24b etc. This portion, although still falling on the pupil mirror device 24 as a whole, will be reflected to locations other than illumination area E, and is therefore effectively suppressed. If desired, a "dump" location can be arranged to receive the DUV radiation from neighboring pupil facet mirrors. Otherwise, the DUV radiation may just be allowed to hit points of the apparatus housing other than the illumination area E.

When the distance R between field facet mirror 22a and pupil facet mirror 24a is given, the size of the three dimensional area 520 is determined by the reflecting surface area of pupil facet mirror 24a. Due to the geometry of a typical fly's eye illuminator system shown in FIG. 5, pupil facet mirror 24a may be very small compared to distance R. Known mirror devices 24 in EUV lithographic devices have pupil facets with dimensions in the range 5 mm to 10 mm, for example 7 mm, while the distance R between mirror devices 22 and 24 is on the order of a meter (for example greater than 80 centimeters). Future devices may have pupil facets which are even smaller than 5 mm. In so-called flexible illuminators, movable field facets mirrors can reflect light to more than one associated pupil facet mirror. Supposing then that there are N, pupil facet mirrors associated to each field facet mirror, the area of the pupil facet, and hence the solid angle it subtends, will scale with 1/N. As a consequence, the higher N, the more effective the DUV suppression becomes. The suppression factor S given by eq. 5 scales with N To suppress radiation with an undesired wavelength by a field facet mirror and its associated pupil facet mirror, the composition and thickness of scattering layer 320 on the field facet mirror can be tuned according to the size of its associated pupil facet mirror to achieve a desirable suppression factor, while minimizing attenuation of the wanted EUV radiation. Because of the very small angle subtended by an individual pupil facet mirror at the distance R, to obtain a desired degree of suppression of DUV reaching the illumination area E, scattering layer 320 of field facet mirror 22a can be made to be thinner and can scatter radiation with smaller angles than is proposed in the prior art. In particular, there is no need for scattering layer 320 of field facet mirror 22a to substantially scatter radiation with an undesired wavelength out of the whole pupil mirror device 24. Instead, the radiation with an undesired wavelength is allowed to be incident on neighboring pupil facet mirrors of pupil mirror device 24 and will be directed onto an area outside the mask MA, as shown in FIG. 12. As an example, the scattering layer 320 may be designed to provide a scattering angle for DUV radiation within the range of 1 to 100 mrad. The scattering layer 320 may be a layer having a thickness of 20 to 100 nanometers, and may for example be a monolayer of silicon particles. Suppression factors of twenty, fifty or a hundred times may be achieved (DUV transmission 5%, 2% or 1%), with minimal EUV attenuation (e.g., less than 10% or less 5% loss). The scattering can be orders of magnitude weaker than a Lambertian scatterer (for example 10× or 100× or 500× weaker), and still achieve 20× or 100× suppression of DUV radiation.

Figure 13:
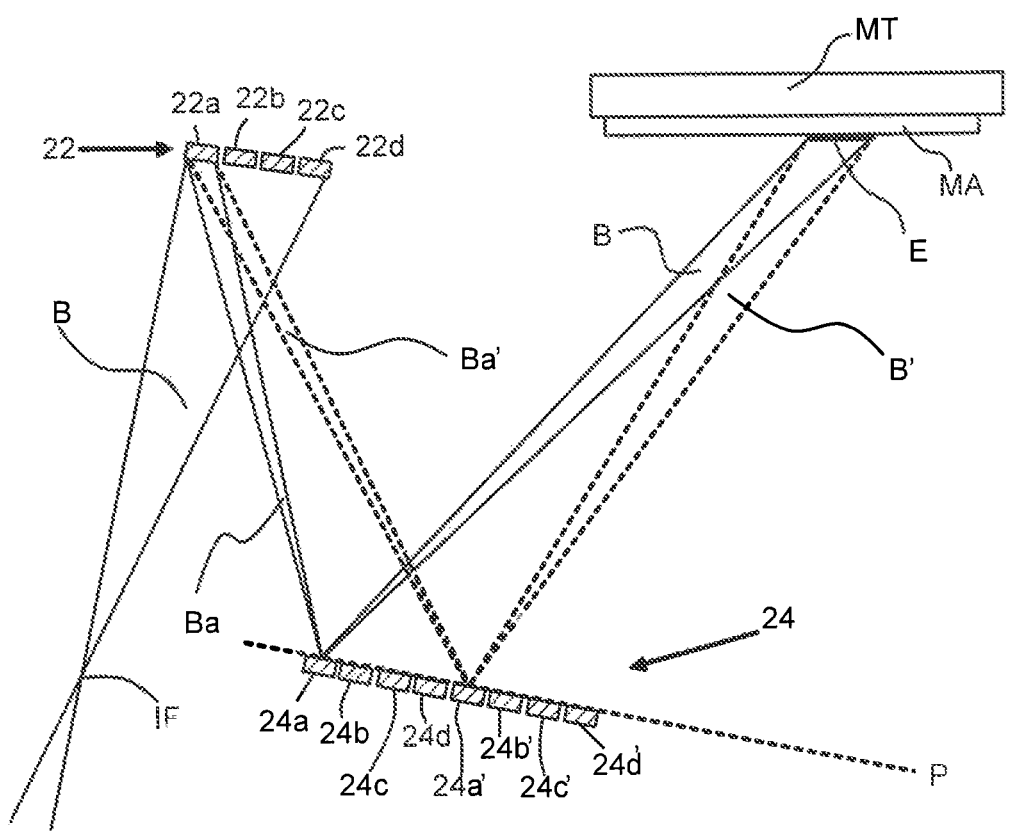
FIG. 13 is a cross sectional view of another exemplary apparatus where a primary reflective element has two associated secondary reflective elements according to an embodiment of the invention.

As mentioned already, each field facet mirror 22a-d of field mirror device 22 may have more than one associated pupil facet mirrors of pupil mirror device 24. A field facet mirror of field mirror device 22 can be controlled to cooperate with different ones of its associated pupil facet mirrors at different times. For example, as shown in FIG. 13, field facet mirror 22a has two associated pupil facet mirrors 24a and 24a'. These are used in different illumination modes of illuminator 20. Field facet mirror 22a may thus be controlled in a second mode to direction EUV radiation towards pupil facet mirror 24a' instead of 24a, while radiation with an undesired wavelength, such as DUV radiation may be scattered to fall onto neighboring pupil facet mirrors like 24c, 24d, 24b' or 24c'. In some embodiments, pupil facet mirrors may also have controllable orientation. Again, the design can be made such that the pupil facet mirrors most closely surrounding the associated mirror will direct the scattered DUV radiation away from the target (illumination area E).

Figure 14:
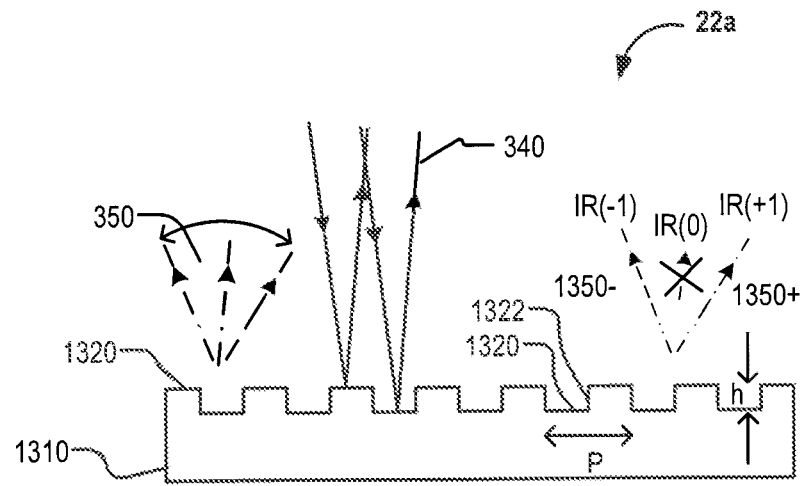
FIG. 14 depicts a modified exemplary optical element which can be used in the system as a primary reflective element and which includes a phase grating structure.
Figure 15:
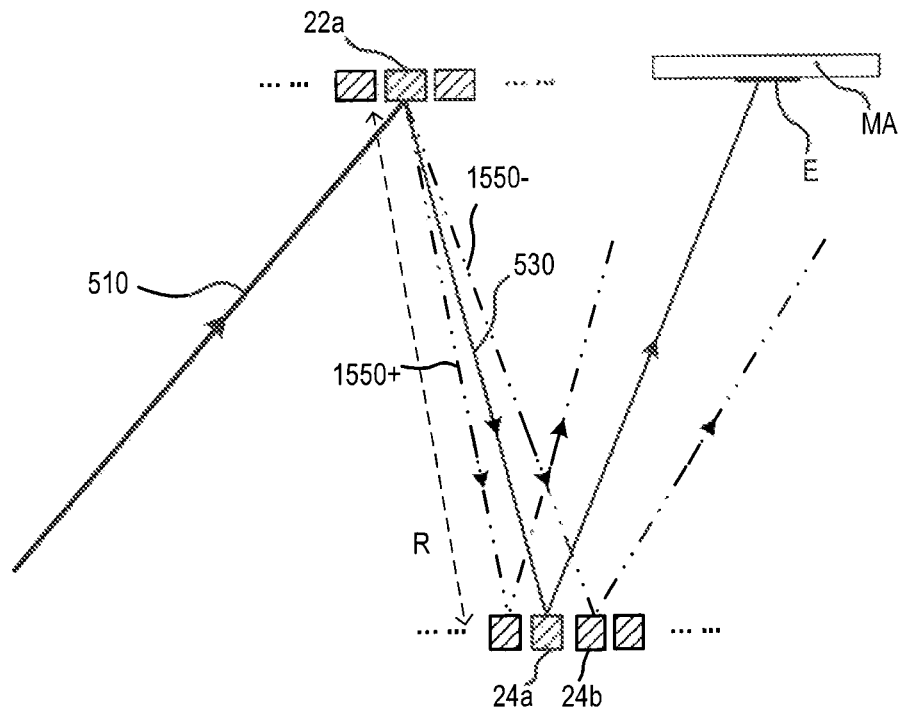
FIG. 15 illustrates a function of the phase grating of the element of FIG. 14, when used in the application of FIG. 12.

Referring now to FIGS. 14 and 15, a further modification can be made to an optical element (such as the field facet mirror 22a-22d) to add a function of deflecting unwanted radiation of a wavelength much longer than the DUV radiation that is scattered by the techniques described and illustrated above. A particular problem in some EUV apparatuses arise from the use of laser as the energy source for forming the EUV-emitting plasma 210 (see FIG. 3, above). This laser emits a beam of radiation that becomes mixed with the radiation emitted by the plasma. The laser in known apparatuses is typically a $CO_2$ laser, which emits infrared (IR) radiation at a wavelength of 10.6 μm. Spectral purity filters tailored to absorb or reflect the IR radiation are therefore required in known apparatuses, as well as measures to reduce unwanted DUV radiation. Infrared wavelengths longer than 1 μm are clearly many times longer than the wavelength of the wanted EUV radiation, for example over 500 times longer. The IR wavelength is too long to be scattered by the scattering layer 320.

The modified element 1310 of FIG. 14 includes an EUV-reflecting structure the same as element 310 in the previous examples, and this is coated with a thin DUV-scattering layer 1320, similar to the layer 320 described above. As indicated schematically in the diagram, reflected DUV radiation 350 spreads over a range of angles, sufficiently that only a minor portion of it will impinge on the associated pupil facet mirror 24a etc. This function is identical to that described above with reference to FIGS. 6 to 13.

The modified element further is provided with a series of steps 1322 so that alternate strips of the reflecting surface are displaced by a height h, to form a phase grating with pitch P. By designing the height and pitch of the steps 1322 to suit the wavelength of the IR laser radiation (which is relatively narrowband and well-defined), substantially all the energy at the IR wavelength can be diverted into +1 and −1 order diffracted beams 1350+ and 1350−. The IR radiation in a zero order beam (IR(0)), which points in same direction as the wanted EUV radiation 340, can be reduced close to zero.

The height h of the steps 1322 may be for example one quarter of the IR wavelength, to achieve maximum suppression of the zero order radiation. In other words, for a laser of 10.6 μm wavelength and a beam arriving normal to the reflecting element 1310, a step height of 2.65 μm may be appropriate. The pitch P of the grating may be chose to deflect the beams 1350+ and 1350− to desired locations according to well-known principles. For the manufacture of the steps in a multilayer mirror structure (MLM) such as an EUV reflecting element, various processes are possible. In a first method, the MLM structure is manufactured on a flat substrate, then etched away selectively to form the steps. The MLM structure in that method is initially made much deeper than normal (more layer pairs), to compensate for the height h lost in the etching. Alternatively, a substrate with steps could be formed, and then an MLM structure formed on top of it, with the desired number of layer pairs. Both processes in theory produce the same result, but in practice it may be difficult to form a high quality MLM on a stepped substrate, compared with an MLM formed on a flat substrate.

FIG. 15 shows the application of the modified reflecting element of FIG. 14 as a field facet mirror 22a in fly's eye illuminator of an EUV optical system as shown in FIG. 5. The function of DUV scattering by scattering layer 1320 exists as illustrated in FIG. 12, but is not shown in FIG. 15, for clarity. Ray 530 represents, as before, the wanted EUV radiation which is reflected directly from field facet mirror 22a to the associated pupil facet mirror 24a, and directed to target area E. Rays 1550+ and 1550− show the +1 and −1 order beams of the unwanted IR radiation that are diffracted by the phase grating provided on mirror 22a. By controlling the pitch P of the grating (FIG. 14), these beams can be directed to neighboring pupil facet mirrors, as shown in FIG. 15, or they may be directed to other locations. Other locations might be for example locations completely outside the pupil facet mirror device 24, or they might be "dump" locations in spaces between the pupil facet mirrors 24a, 24b etc. The designer can choose freely between these locations, provided that suitable measures are in place to absorb and conduct away the heat energy contained in the diffracted beams.

Because the wavelength of the IR radiation is so much longer than that of the EUV radiation, the strips forming the grating are effectively flat mirrors for the EUV radiation, and no diffraction grating is seen at the shorter wavelengths. The only penalty at EUV wavelengths should be a potential shadowing effect of the steps, and loss of EUV light at the locations of the steps 1322 themselves. These losses can be minimized by appropriate selection of the orientation of the grating. It should also be borne in mind that the field facet mirrors 22a etc. may be tiltable to different angles, as illustrated in FIG. 13. The orientation of the grating can be selected in relation to the tilt axis, so that the shadowing effect is minimized at all settings, is minimized at one favored setting, or is at least constant across settings. In the example of a field facet mirror in an EUV lithographic apparatus that implements a scanning mode of operation, the individual facet mirrors 22a etc. may be elongated in form, for example being a few mm wide and a few centimeters long. If the line of the phase grating are aligned with the long direction of the facet mirror, there may be only a few steps 1322 required, for example less than 10. These considerations will all be apparent to the skilled reader from a consideration of the foregoing comments and examples, so that a suitable practical embodiment can be realized.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents

What is claimed is:

1. An optical apparatus comprising:
    a first reflective component comprising a primary reflective element and configured to reflect a radiation beam from a radiation source toward a second reflective component;
    the second reflective component comprising an array of secondary reflective elements and configured to reflect the radiation beam to a target location,
    wherein:
        the radiation beam comprises a first beam having a first wavelength range and a second beam having a second wavelength range;
        an orientation of the primary reflective element is controllable so as to reflect the first beam toward an associated secondary reflective element or toward one of a subset of associated secondary reflective elements at different times during use; and
        the primary reflective element scatters the second beam such that it is directed toward the second reflective component, but not toward the associated secondary reflective element or toward the subset of associated secondary reflective elements.

2. The optical apparatus according to claim 1, wherein the majority of the second beam is more than about 75%, 85%, 95%, or 99%.

3. The optical apparatus according to claim 2, wherein a distance from the primary reflective element to the associated secondary reflective element or to one of a subset of associated secondary reflective elements is more than 10 times or more than 20 times a minimum lateral dimension of the associated secondary reflective element or of one of a subset of associated secondary reflective elements.

4. The optical apparatus according to claim 1, wherein the first wavelength range is in the EUV wavelength range of about 5-20 nm, or in the range of about 13-14 nm, or in the range of about 6.5-7 nm.

5. The optical apparatus according to claim 1, wherein the second wavelength range is in the DUV wavelength range of about 100-400 nm or about 110-300 nm.

6. The optical apparatus according to claim 1, wherein each of the associated secondary reflective elements is surrounded in the array of secondary reflective elements by secondary reflective elements that will direct radiation received from the primary reflective element in a direction away from the target location.

7. The optical apparatus according to claim 1, wherein the primary reflective element comprises a mirror structure for reflecting the first beam and a coating on top of the mirror structure for scattering the second beam.

8. The optical apparatus according to claim 7, wherein the coating comprises a layer of less than about 30 nm thickness.

9. The optical apparatus according to claim 7, wherein the coating comprises a layer of silicon particles of dimension less than about 100 nm or less than about 30 nm.

10. The optical apparatus according to claim 9, wherein the layer of silicon particles is substantially a monolayer.

11. The optical apparatus according to claim 7, wherein the coating comprises a corrugated layer.

12. The optical apparatus according to claim 1, wherein the radiation beam further comprises a third beam having a wavelength longer than 1 μm and wherein the primary reflective element incorporates a phase grating structure configured to suppress the third beam.

13. The optical apparatus according o claim 1, wherein the primary reflective element is one of an array of primary reflective elements, and wherein each one of the secondary reflective elements is configured to form an image of its associated primary reflective element at or near a field plane, the respective images being substantially overlapping.

14. A lithographic apparatus, comprising:
    an illumination system;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate; and
    an optical apparatus comprising:
        a first reflective component comprising a primary reflective element, wherein the first reflective component is configured to reflect a radiation beam from a radiation source toward a second reflective component;
    the second reflective component comprising an array of secondary reflective elements, wherein the second reflective component is configured to reflect the radiation beam to a target location,
    wherein:
        the radiation beam comprises a first beam having a first wavelength range and a second beam having a second wavelength range;
        an orientation of the primary reflective element is controllable so as to reflect the first beam toward an associated secondary reflective element or toward one of a subset of associated secondary reflective elements at different times during use; and the primary reflective element scatters a majority of the second beam away from the associated secondary reflective element or the subset of associated secondary reflective elements.

15. A device manufacturing method comprising:
conditioning a radiation beam using an optical system comprising:
a first reflective component comprising a primary reflective element and configured to reflect a radiation beam from a radiation source toward a second reflective component;
the second reflective component comprising an array of secondary reflective elements and configured to reflect the radiation beam to a target location,
wherein:
the radiation beam comprises a first beam having a first wavelength range and a second beam having a second wavelength range;
an orientation of the primary reflective element is controllable so as to reflect the first beam toward an associated secondary reflective element or toward one of a subset of associated secondary reflective elements at different times during use; and
the primary reflective element scatters the second beam such that a majority of the second beam is directed toward the second reflective component, but not toward the associated secondary reflective element or toward the subset of associated secondary reflective elements; and
projecting a patterned beam of radiation onto a substrate, wherein the patterned beam is formed from the conditioned radiation beam.

16. An optical apparatus comprising:
a primary reflective element, and
an array of secondary reflective elements comprising an associated secondary reflective element configured to project the primary reflective element onto a target location, wherein:
the primary reflective element is configured to receive a portion of a radiation beam from a radiation source and is controllable so as to reflect the portion of the radiation beam toward the associated secondary reflective element or toward one of a subset of associated secondary reflective elements at different times during use;
the portion of the radiation beam comprises a first beam having a first wavelength range and a second beam having a second wavelength range; and
the primary reflective element is formed such that a majority of the second beam is scattered toward one or more elements of the plurality of secondary reflective elements different from the associated secondary reflective element.

17. The optical apparatus according to claims 16, wherein:
the primary reflective element is one of an array of primary reflective elements,
wherein each primary reflective element is:
associated with a respective secondary reflective element configured to project the primary reflective element onto the target location;
configured to receive a respective portion of the radiation beam from the radiation source and to reflect the respective portion of radiation to the respective associated secondary reflective element, wherein the respective portion of the radiation beam comprises a respective first beam having a first wavelength range and a respective second beam having a second wavelength range; and
formed such that a majority of the respective second beam is scattered toward one or more elements of the plurality of secondary reflective elements different from the associated respective secondary reflective element.

18. The optical apparatus according to claim 16, wherein the radiation beam further comprises a third beam having a wavelength longer than 1 μm and wherein the primary reflective element incorporates a phase grating structure configured to suppress the third beam.

19. The optical apparatus according to claim 16, wherein the first wavelength range is in the EUV wavelength range of about 5-20 nm, or of about 13-14 nm or of about 6.5-7 nm.

20. An optical apparatus comprising:
a primary reflective element; and
an array of secondary reflective elements comprising an associated secondary reflective element configured to project the primary reflective element onto a target location, wherein:
the primary reflective element is configured to receive a portion of a radiation beam from a radiation source and to reflect the portion of the radiation beam to the associated secondary reflective element,
the portion of the radiation beam comprises a first beam having a first wavelength range and a second beam having a second wavelength range, and
the primary reflective element is formed such that a majority of the second beam is scattered toward one or more elements of the plurality of secondary reflective elements different from the associated secondary reflective element,
wherein the majority of the second beam is more than about 75%, 85%, 95%, or 99%.

* * * * *